(12) United States Patent
Bingert et al.

(10) Patent No.: US 6,822,477 B1
(45) Date of Patent: *Nov. 23, 2004

(54) INTEGRATED CIRCUIT AND ASSOCIATED DESIGN METHOD USING SPARE GATE ISLANDS

(75) Inventors: Craig Bingert, Allentown, PA (US); Christopher D. Gorsuch, Walnutport, PA (US); Oscar G. Mercado, Bethlehem, PA (US); Anthony K. Myers, Hamburg, PA (US); John A. Schadt, Bethlehem, PA (US); Brian W. Yeager, Schuykill Haven, PA (US)

(73) Assignee: Lattice Semiconductor Corp., Hillsboro, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/600,042

(22) Filed: Jun. 20, 2003

Related U.S. Application Data

(63) Continuation of application No. 10/135,325, filed on Apr. 30, 2002, now Pat. No. 6,600,341.
(60) Provisional application No. 60/287,900, filed on May 1, 2001.

(51) Int. Cl.[7] .......................................... H03K 19/117
(52) U.S. Cl. ............................. 326/41; 341/38; 341/44
(58) Field of Search .......................... 326/41, 44, 102, 326/38; 365/51, 200

(56) References Cited

U.S. PATENT DOCUMENTS

| | | | |
|---|---|---|---|
| 4,228,528 A | 10/1980 | Cenker et al. | |
| 4,319,396 A | 3/1982 | Law et al. | |
| 4,321,695 A | * 3/1982 | Redwine et al. | ............ 365/200 |
| 4,870,302 A | 9/1989 | Freeman | |
| 5,313,119 A | 5/1994 | Cooke et al. | |
| 5,384,497 A | 1/1995 | Britton et al. | |
| 5,416,740 A | 5/1995 | Fujita et al. | |
| 5,459,342 A | 10/1995 | Nogami et al. | |
| 5,679,967 A | 10/1997 | Janai et al. | |
| 5,696,943 A | 12/1997 | Lee | |
| 5,777,887 A | 7/1998 | Marple et al. | |
| 5,892,249 A | 4/1999 | Courtright et al. | |
| 5,959,905 A | 9/1999 | Payne | |
| 6,020,755 A | 2/2000 | Andrews et al. | |
| 6,222,211 B1 | 4/2001 | Chen | |
| 6,404,226 B1 | 6/2002 | Schadt | |
| 2002/0163354 A1 | 11/2002 | Bingert et al. | |

* cited by examiner

*Primary Examiner*—Michael Tokar
*Assistant Examiner*—Lam T. Mai

(57) ABSTRACT

An integrated circuit includes standard cells interspersed with islands of spare gates. The spare gates are arranged in multiple groups of spare gates, with each group of spare gates within a corresponding designated spare gate area of a standard cell portion of the integrated circuit. At least a given one of the groups of spare gates is arranged between first and second rows of the standard cells and includes one or more rows of spare gates. The spare gate islands may be distributed throughout the standard cell portion of the integrated circuit in a substantially uniform manner, for example, in accordance with a predetermined geometric pattern. The spare gates may be converted to active gates in conjunction with the automated place and route process using only conductors in one or more metal layers of the integrated circuit.

20 Claims, 8 Drawing Sheets

INTEGRATED CIRCUIT AND ASSOCIATED DESIGN METHOD USING SPARE GATE ISLANDS

RELATED APPLICATION DATA

This application is a continuation of application Ser. No. 10/135,325, filed Apr. 30, 2002, now U.S. Pat. No. 6,600,341, which claims the benefit of U.S. Provisional Application Ser. No. 60/287,900, filed May 1, 2001.

The present invention is related to the invention described in U.S. patent application Ser. No. 10/082,050, filed Feb. 14, 2002 and U.S. patent application Ser. No. 09/400,029, filed Sep. 21, 1999, now U.S. Pat. No. 6,404,226, both of which are commonly assigned herewith and hereby incorporated by reference herein.

TECHNICAL FIELD

The present invention relates generally to integrated circuits and integrated circuit design processes, and more particularly to techniques for arranging and implementing spare gates in an integrated circuit design.

BACKGROUND

Standard cell application-specific integrated circuits (ASICs) provide a number of significant advantages over other types of integrated circuits, including more manageable die size, lower piece-part cost, higher performance, and more reliable design flow. The standard cell approach is generally considered preferable to other competing approaches such as custom design and programmable logic. As a result, most existing integrated circuit computer-aided design (CAD) tools, such as place and route tools, are configured for operation with the standard cell approach. Examples of standard cell CAD tools known in the art include the Apollo toolset commercially available from Avanti, and the Silicon Ensemble and First Encounter toolsets commercially available from Cadence Design Systems. In general, CAD tools designed for programmable logic are often incompatible with standard cell tools and may require specially trained experts.

One potential problem associated with the standard cell approach is that non-recurring expense (NRE) and process cycle time for development of a given design may still be unduly high. The principal components of the NRE are the cost of a new lot start and the cost of a new mask set as required to implement changes in a standard cell design. As the transistor technology shrinks in size, the lot start and mask set costs can increase considerably. With regard to process cycle time, ASICs typically undergo several design iterations before qualifying for full production. Reaching production with pure standard cell technology can thus be costly and time consuming at a time when market forces are squeezing costs and shortening development cycles.

A number of techniques have been developed in an attempt to alleviate the above-noted problem of the standard cell approach.

One such technique involves the use of so-called multi-chip shuttles to amortize the lot start and mask set costs over several chips. Basically, a prototype lot is ordered for model production only where there may be four to six individual chips placed on the same wafer and reticle. The drawbacks of this technique include a limited die size for each constituent chip, difficulty in timing and coordination of mask order and other functions across four to six chip projects, and potential saw-apart and packaging problems.

Another known technique involves the embedding of spare standard cell gates in a chip netlist to be used at a later time for design changes. However, these spare gates are generally hand-instantiated into the netlist by the customer, the level of design change supported is extremely limited, and wiring the change into the design can be difficult due to poor cell placement.

A third technique involves embedding programmable logic within a standard cell ASIC. However, as mentioned previously, programmable logic generally requires specialized CAD tools, and thus can create tool interface problems when used in a standard cell ASIC. For example, the use of a gate array place and route tool for a standard cell ASIC will generally require conversion of standard cell tool infrastructure over to the gate array tool and corresponding re-training of standard cell tool users, thereby imposing a high development cost burden on what are typically only a few candidate applications. In addition, the use of programmable logic can create difficult "floor plan" issues. Other drawbacks include the fact that programmable gate array density is typically only half to less than half the density of standard cell, which affects die size and thus piece part cost, and can also impact performance.

It is therefore apparent that a need exists for improved techniques for arranging and implementing spare gates in an integrated circuit design, preferably in a manner that is programmable but also fully compatible with standard cell CAD tools.

SUMMARY

The present invention solves one or more of the above-noted problems by providing spare gates distributed in "islands" or other types of groups throughout an integrated circuit design prior to or in conjunction with a place and route process, and then converting one or more of the spare gates within the place and route process to active logic gates. The invention in an illustrative embodiment utilizes spare gates that are constructed by replication of a base transistor structure of a programmable cell technology that is fully compatible with standard cell CAD tools.

In accordance with one aspect of the invention, an integrated circuit includes standard cells interspersed with spare gates. The spare gates are arranged in multiple groups of spare gates. At least a given one of the groups of spare gates is arranged between first and second rows of the standard cells. The spare gates may be converted to active gates in conjunction with the automated place and route process using only conductors in one or more metal layers of the integrated circuit.

In an illustrative embodiment, the multiple groups of spare gates are configured as a plurality of spare gate islands distributed throughout the standard cell portion of the integrated circuit, with one of more of the spare gate islands comprising an m×n array of spare gate cells arranged between rows of the standard cells, where both m and n are greater than one. Each of at least a subset of the spare gates in the given group preferably comprises a plurality of the base transistor structures. The spare gate islands may be distributed throughout the standard cell portion of the integrated circuit in a substantially uniform manner, for example, in accordance with a predetermined geometric pattern. The spare gate islands may therefore themselves be configured in the form of an array, that is, an array of spare gate islands distributed throughout the standard cell portion of the integrated circuit.

As noted above, the standard cells and spare gates are preferably placed in accordance with a placement operation of an automated place and route process of a standard cell CAD tool, and the spare gates are preferably implemented using a base transistor structure compatible with the standard cell CAD tool. The spare gate areas may be defined using a floorplan operation of the standard cell CAD tool.

DETAILED DESCRIPTION

The present invention will be described in conjunction with illustrative techniques for arranging and utilizing spare gates in an integrated circuit design in conjunction with an automated place and route process. The place and route process is preferably part of a standard cell computer-aided design (CAD) tool. In the illustrative embodiments, the spare gates are implemented using a base transistor structure that is fully programmable. The term "programmable" in this context is intended to include without limitation arrangements in which circuit functionality is alterable by changes in metallization layers only. For example, the spare gates implemented using the base transistor structure in the illustrative embodiments of the invention described herein may be elevated to a designated metal layer, e.g., a Metal 2 (M2) layer, using elevation studs, vias or other similar mechanisms, such that any configuration of spare gates into active gates can be implemented in the M2 layer. Similar techniques may be used to elevate the interconnections for the base transistor structures to other metal layers. The spare gates are typically convertible to active gates through changes in only a subset of the metallization layers of the integrated circuit, which provides considerable simplification and cost savings in the design process. It should be noted that the term "spare gate" as used herein is intended to include without limitation spare gate cells as well as other types of circuitry suitable for interconnection with standard cell circuitry in a given integrated circuit design, such as programmable gates or other types of circuits specifically set aside for altering circuit design functionality subsequent to an initial design.

Figure 1:
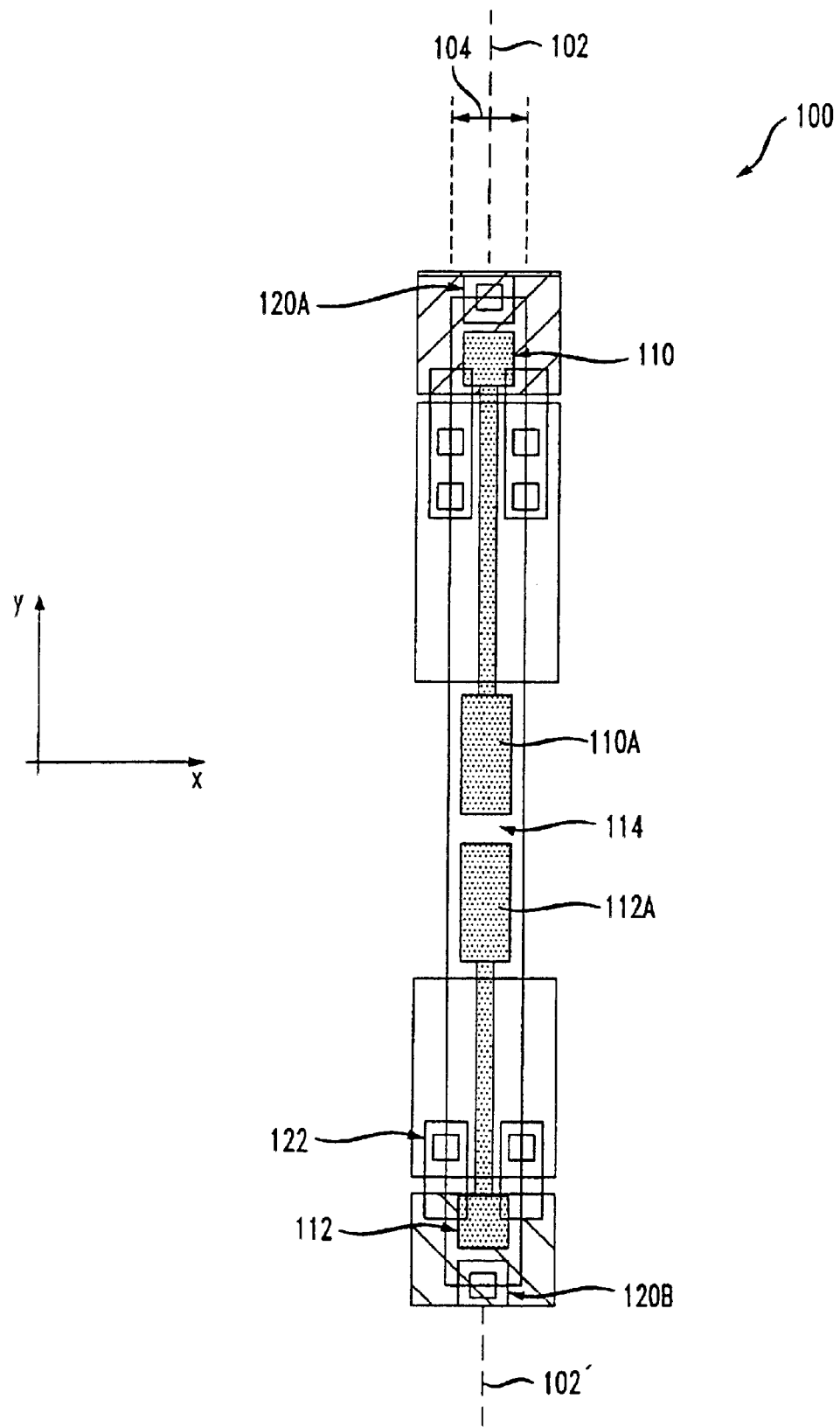
FIG. 1 shows an example base transistor structure suitable for use in forming spare gates for use in conjunction with the present invention.

FIG. 1 shows a base transistor structure 100 of the type described in the above-cited U.S. patent application Ser. No. 10/082,050, filed Feb. 14, 2002 in the name of inventors Stephen R. Cebenko et al. and entitled "Integrated Circuit Base Transistor Structure and Associated Programmable Cell Library." The base transistor structure 100 may be used as a building block to create spare gates suitable for conversion to active gates in accordance with the techniques of the invention. The base transistor structure 100 in this embodiment is symmetric about vertical dashed line 102–102☐ corresponding to a y-axis and has a width that corresponds approximately to an x-grid width 104 of a conventional standard cell CAD tool, e.g., a standard cell place and route tool. This single grid symmetry advantageously allows cells created from the base structure to fully emulate standard cell behavior within a standard cell CAD tool environment. The single grid symmetry is also very area efficient.

It should be noted that the x-grid width and other dimensions of the base transistor structure as utilized for standard cells may differ from that utilized for spare gate cells. For example, the x-grid width and height of a given spare gate cell may be slightly larger than the corresponding width and height, respectively, of a standard cell. Standard cell CAD tools generally support such mixed-grid applications but typically only function well when one particular grid width is dominant. For the illustrative embodiments described herein, in which the integrated circuit is primarily formed of standard cells with interspersed spare gates or spare gate cells present in substantially lower numbers relative to the standard cells, the standard cell grid width is typically dominant.

An integrated circuit comprising multiple base transistor structures arranged in rows may be assumed for illustrative purposes to be configured such that each row runs along the x-axis and one moves from one row to an adjacent row by moving along the y-axis.

The base transistor structure 100 includes a pair of split gates 110 and 112 having respective extended regions 110A and 112A separated as indicated at 114. Gate isolation can be provided using this split gate arrangement, as is described in greater detail in the above-cited U.S. patent application Ser. No. 10/082,050.

The gates extend below a power bus in order to allow transistors to be disabled and to create source and drain isolation regions. The gate extensions permit so-called "crossover" routing within cells so as to allow a more compact cell width. As is apparent from FIG. 1, the base transistor structure 100 is uniform and symmetric. This base structure ensures that all cell-level connections between a given set of the structures can be created by means of metal layer changes only.

In an example standard cell CAD tool environment, the cells are row based, and a given cell can move along a row in single grid increments. The cells can be flipped and rotated about the y-axis, and can be any number of grids in length. The cell outlines and pin terminals are all typically placed on a grid of the standard cell CAD tool. The base transistor structure 100 of FIG. 1 is particularly well suited for use in this type of standard cell CAD tool environment, but can also be used in other environments. More particularly, the base transistor structure 100 is preferably implemented using the above-noted single grid symmetry, so as to provide full compatibility with standard cell CAD tools.

It should be noted that spare gate cells may be either on-grid or off-grid entities due to their typical minority usage in a given implementation relative to standard cells.

The base transistor structure 100 includes a number of well ties implemented as indicated generally at 120A and 120B. These well ties are preferably shared between rows of a given cell. More particularly, in an embodiment which includes multiple rows of cells each formed from one or more of the base transistor structures 100, the upper well tie 120A associated with a particular base transistor structure in a given row also serves as the lower well tie in a corresponding base transistor structure in the row immediately above the given row, while the lower well tie 120B associated with the particular base transistor structure in the given row also serves as the upper well tie in the row immediately below the given row. The well ties may also be separated between rows. The metallization as shown generally at 122 is included in the figure for reference purposes only, and may be considered at least in part as separate from the base transistor structure 100.

The well ties may be shared, in the manner described above, between different spare gates as well as between spare gates and standard cells.

The base transistor structure 100 of FIG. 1 may be viewed, by way of example and without limitation, as providing a pair of field effect transistors (FETs), i.e., a P-type FET (PFET) and an N-type FET (NFET), suitable for use in otherwise conventional complementary metal-oxide-semiconductor (CMOS) logic circuitry. The gates 110 and 112 of the base transistor structure may therefore correspond to gates of the respective PFET and NFET devices, with similar correspondence between source and drain elements of the base transistor structure and source and drain elements of the respective PFET and NFET devices. When arranged in rows, the base transistor structures may be configured such that the PFET devices in one row are adjacent PFET devices in an adjacent row, while the NFET devices in one row are adjacent NFET devices in another row. For example, if the upper device associated with a particular base transistor structure in a given row is a PFET device and the lower device associated with the particular base transistor structure in the given row is an NFET device, the lower device in a corresponding base transistor structure in the row immediately above the given row is preferably a PFET device, while the upper device in a corresponding base transistor structure in the row immediately below the given row is an NFET device, and so on for the other base transistor structures. Such an arrangement facilitates the previously-described sharing of well ties.

The particular base transistor structure shown in FIG. 1 is by way of illustration only. Those skilled in the art will recognize that the structure in alternative embodiments may be symmetric about both x and y axes, may have a width other than a single x-grid width, may include gate structures and other transistor structures which differ from those specifically shown, and may be otherwise reconfigured to meet the needs of a particular application.

It should be noted that the transistor devices of the base transistor structure 100 may be constructed using conventional techniques of a type well-known in the art. The base transistor structure in cross-section will therefore be of a type consistent with these well-known conventional techniques, and is therefore not explicitly shown or described herein.

The single grid symmetry in the illustrative transistor base structure of FIG. 1 ensures that a library of circuit cells created from the base transistor structure can fully emulate standard cell behavior within a standard cell CAD tool environment. In the illustrative embodiment, cells are created from a particular arrangement of multiple base transistor structures, and as a result any cell can be replaced by another cell in a standard cell placement operation implemented by a standard cell CAD tool. In addition, the cells can be flipped, rotated, and mirrored on one or more axes by changing only upper programmable metal layers of the circuit design. This type of standard cell compatibility is an important advantage of the base transistor structure of FIG. 1, since a typical integrated circuit design facility generally has a large financial investment in, and is therefore highly dependent on, a given CAD environment.

As is described in the above-cited U.S. patent application Ser. No. 10/082,050, the base transistor structure illustrated in FIG. 1 can be used to implement a wide variety of different types of gates, such as NAND gates, flip-flops, etc. The present invention in the illustrative embodiments thereof to be described below in conjunction with FIGS. 2 through 8 utilizes the base transistor structure of FIG. 1 to form islands of spare gates within an integrated circuit design. One or more of the spare gates may then be converted to active logic gates as required in conjunction with an automated place and route process. It is to be appreciated, however, that the present invention does not require the use of the base transistor structure of FIG. 1, and spare gates formed using other suitable structures can be used. The present invention is more generally applicable to the distribution of spare gates, of any desired form, within a standard cell core and within a standard cell CAD environment.

Figure 2:
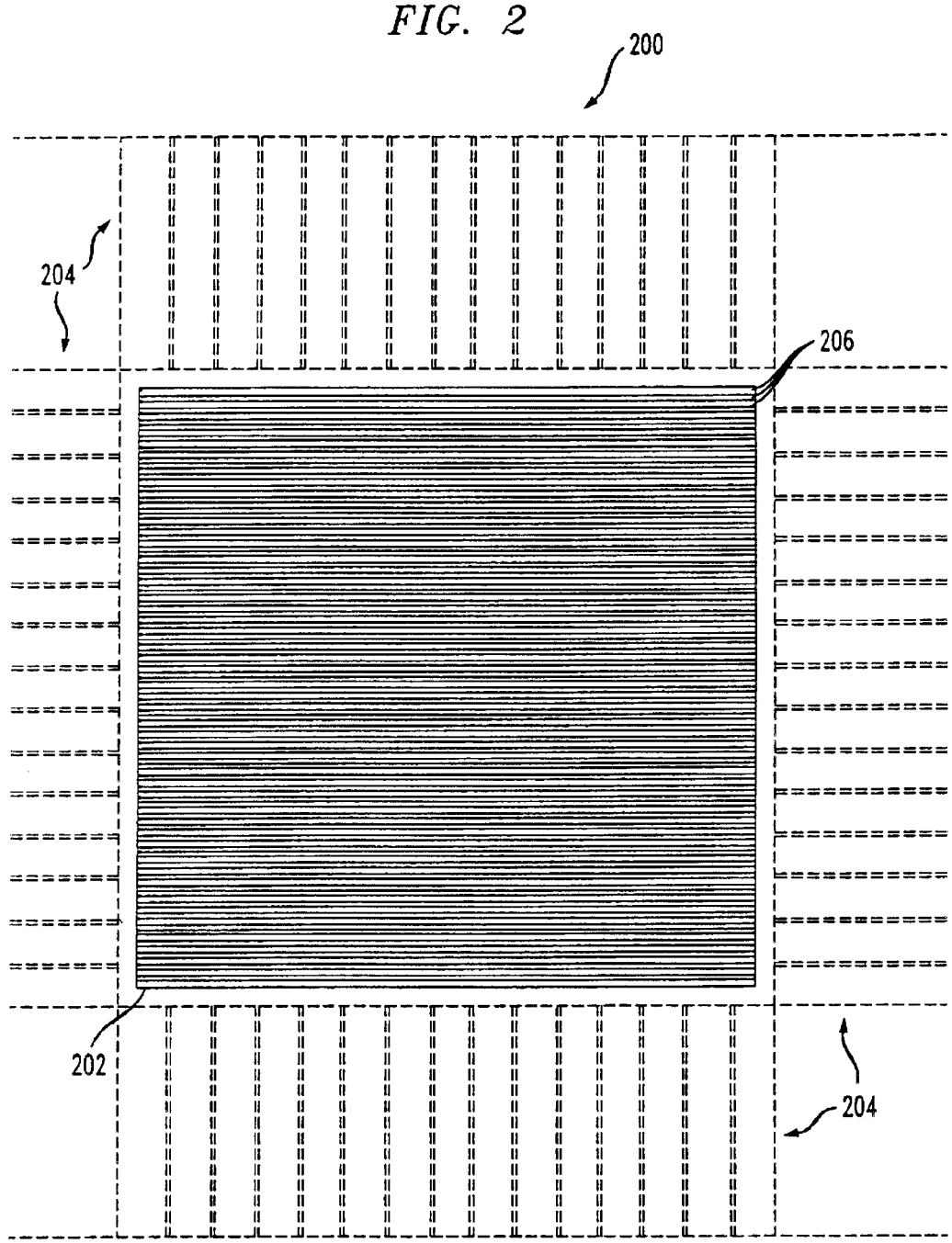
FIG. 2 shows a simplified representation of an integrated circuit having rows of standard cells in which the spare gate arrangements of the present invention may be implemented.

FIG. 2 shows a simplified diagram of a standard cell design layout for a portion of an integrated circuit 200. The diagram may correspond to a representation of the integrated circuit as generated by a standard cell CAD tool prior to application of a routing operation of an automated place and route process. The design layout for the integrated circuit 200 as shown includes a central circuitry portion 202 surrounded by a number of input/output (I/O) buffer circuit areas 204. Wire bonds or other leads are not shown. The central circuitry portion 202 includes multiple rows 206 of standard cells. The standard cells are placed in accordance with a placement operation of the automated place and route process. Each standard cell corresponds generally to a particular predefined type of logic gate or other circuit element that is placeable by a placement operation of the place and route process.

The circuit 200 as shown in FIG. 2 does not include spare gate islands in accordance with the invention, but is an example of a type of integrated circuit design in which such spare gate islands may be incorporated, as will be described below.

Figure 3:
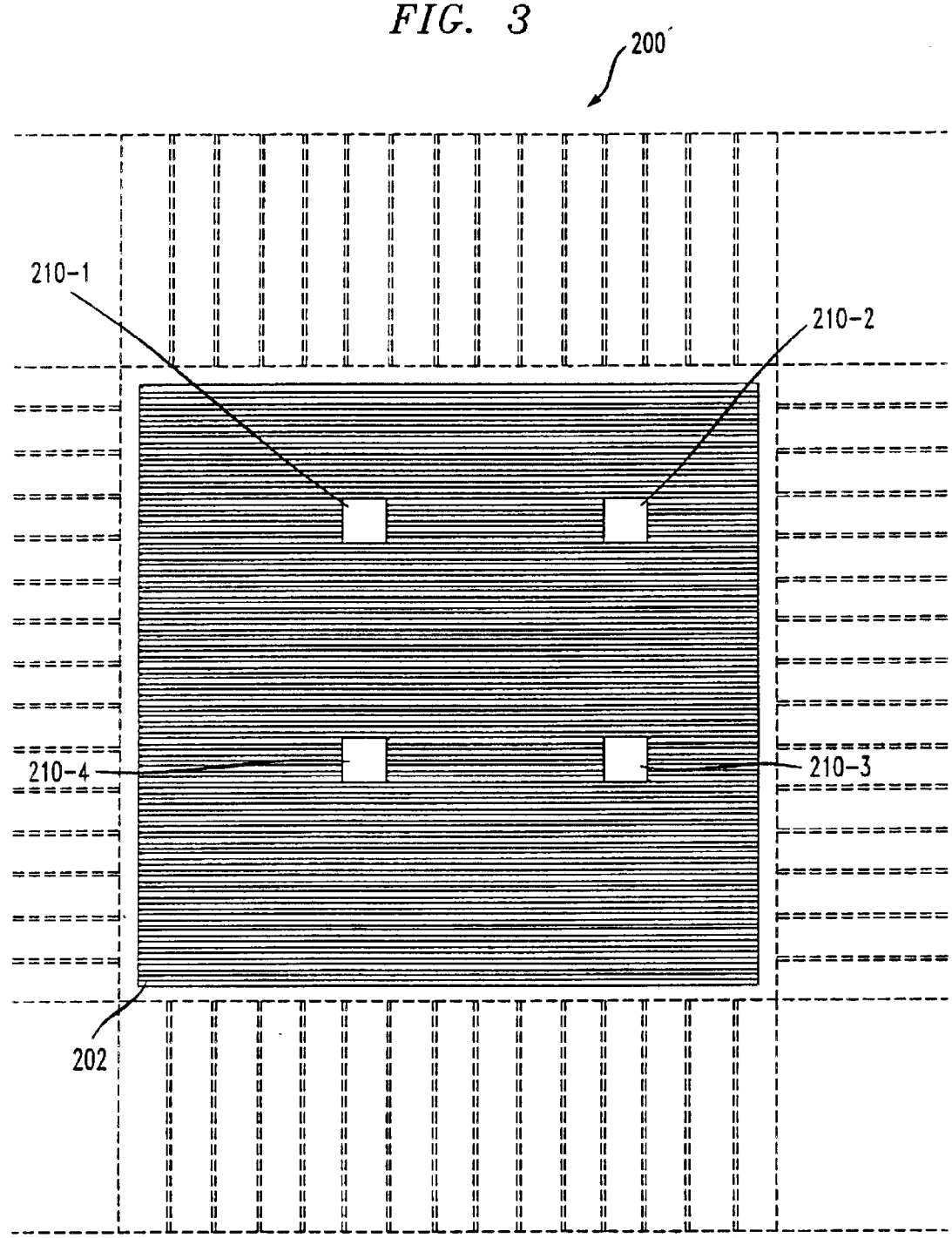
FIG. 3 shows the FIG. 2 integrated circuit modified in accordance with the invention to include a number of island areas for use in implementing spare gates.

FIG. 3 shows the FIG. 2 integrated circuit modified in accordance with the invention to include a number of island areas for use in implementing spare gates. The modified circuit 200□ includes the central circuitry portion 202 and I/O buffer circuit areas 204, but the central circuitry portion 202 has been configured to include four distinct island areas denoted 210-1, 210-2, 210-3 and 210-4. The island areas 210 as shown do not yet include any spare gates, but are intended as areas in which spare gates will later be implemented in conjunction with the place and route process. As will be described in greater detail below, a given one of the island areas 210 may be configured in an illustrative embodiment of the invention to comprise an m×n array of spare gate cells, where both m and n are greater than one. The m×n array pitch in both x and y directions is preferably under user control and can be varied across the integrated circuit as required for a given application. Each of the spare gate island areas 210 is arranged between standard cell rows of the central circuitry portion 202 as shown. More particularly, a given one of the island areas 210 is bounded at its upper edge by a lower edge of a standard cell row, at its lower edge by an upper edge of another standard cell row, and at each of its right and left sides by side edges of multiple standard cell rows.

The island areas 210 and other spare gate areas referred to herein may be defined using a "floorplan" operation of the above-noted standard cell CAD tool. As is apparent from FIGS. 3 and 5, the spare gate islands may themselves be configured in the form of an array, that is, an array of spare gate islands distributed throughout the standard cell portion of the integrated circuit.

Figure 4:
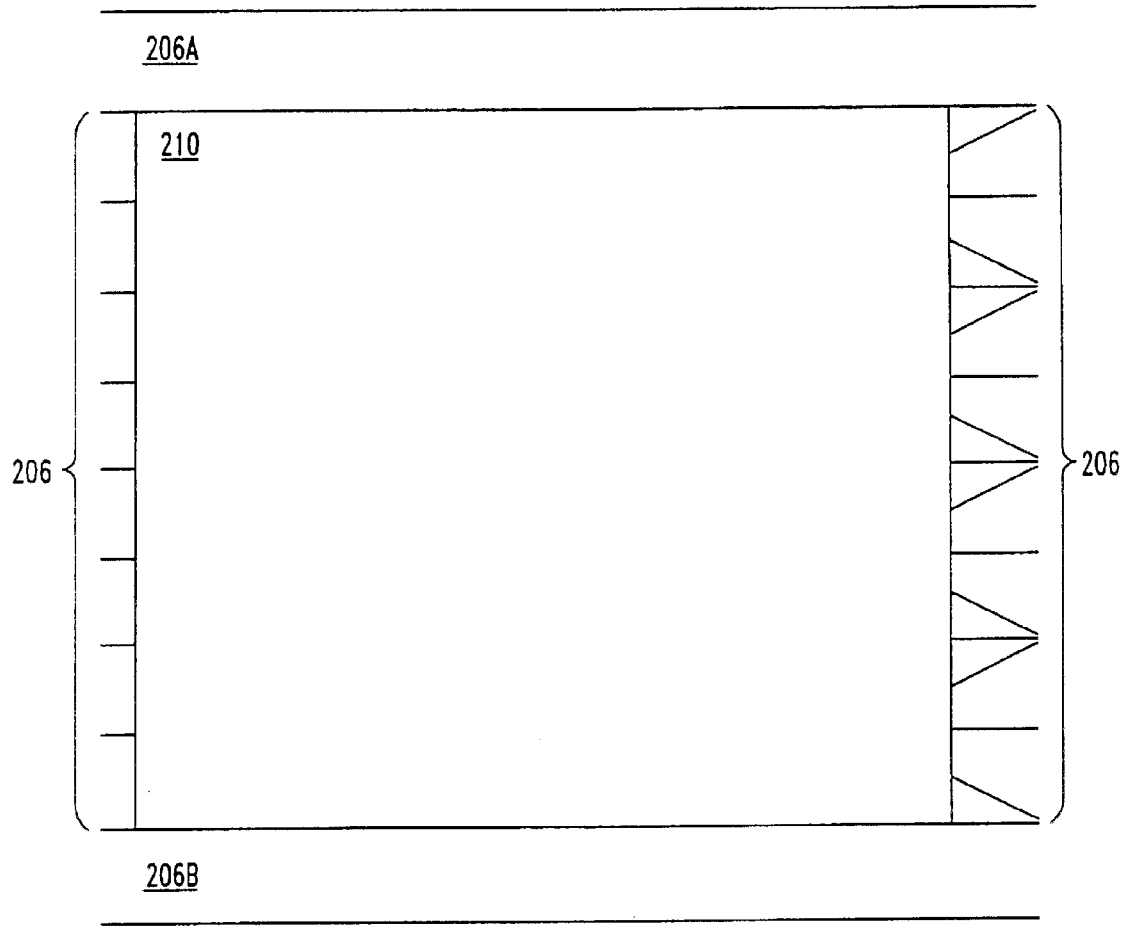
FIG. 4 shows a more detailed view of a particular one of the island areas of the FIG. 3 integrated circuit.

FIG. 4 shows a more detailed view of a particular one of the island areas 210 of the FIG. 3 integrated circuit 200□. It can be seen from the figure that the island area 210 is bounded at its upper edge by a lower edge of a standard cell row 206A, at its lower edge by an upper edge of another standard cell row 206B, and at each of its right and left sides by side edges of other multiple standard cell rows 206. Each of the island areas 210 may be configured in substantially the same manner. Again, the island area 210 as shown does not yet include any spare gates, which may be placed in a placement operation of the above-noted automated place and route process.

Figure 5:
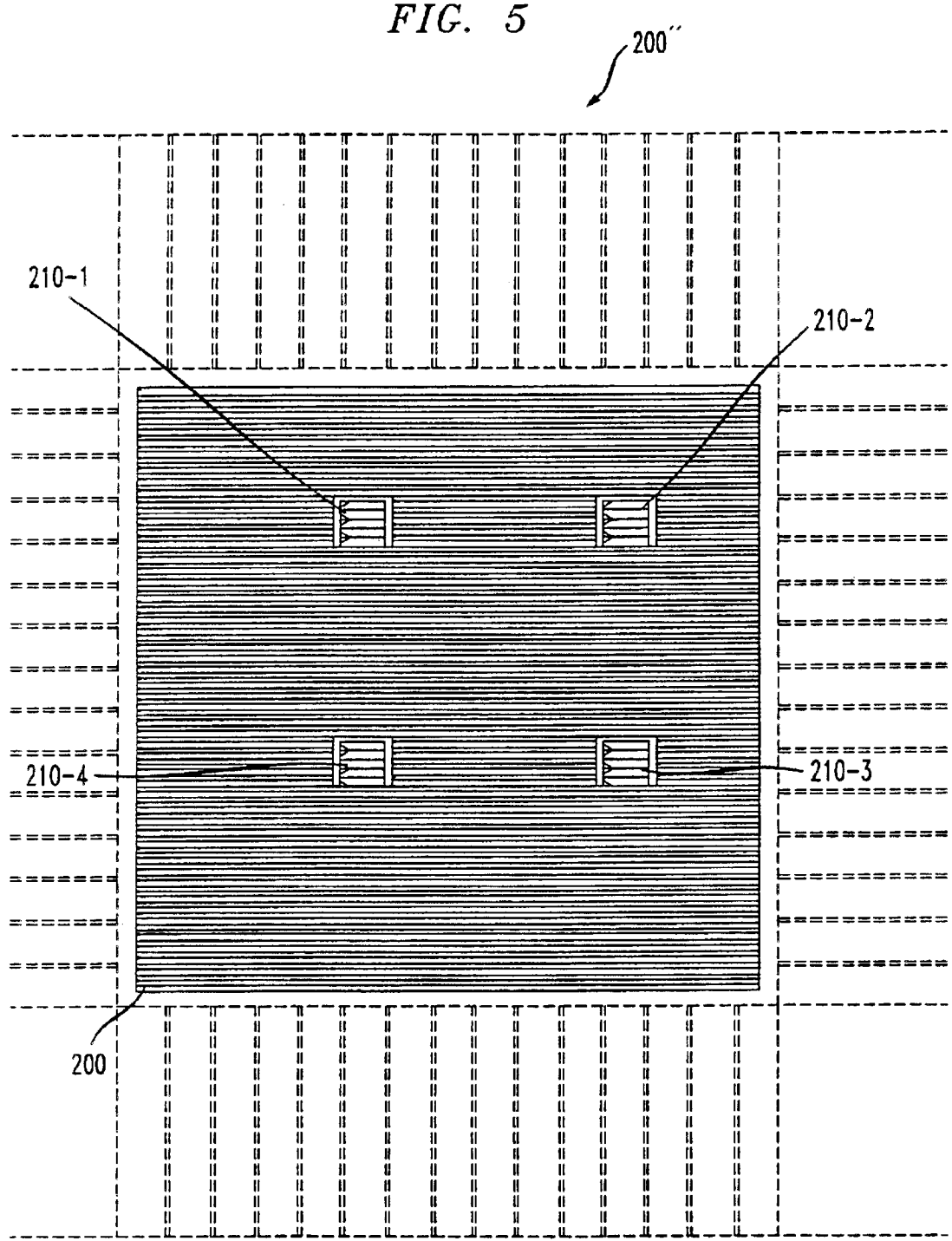
FIG. 5 shows the FIG. 3 integrated circuit with an array of spare gates incorporated into each of the island areas.

FIG. 5 shows the FIG. 3 integrated circuit with an array of spare gates incorporated into each of the island areas 210. The integrated circuit 200□ includes the central circuitry portion 202 with island areas 210-1, 210-2, 210-3 and 210-4 as previously described, but each of the island areas 210 includes a set of five rows of spare gates.

The term "island" as used herein with reference to spare gates is intended to include a group of spare gates, which is completely surrounded, by standard cells. The invention can be implemented using other types of groupings of spare gates, however, such as one or more groups of spare gates bounded on only three sides by standard cells.

Figure 6:
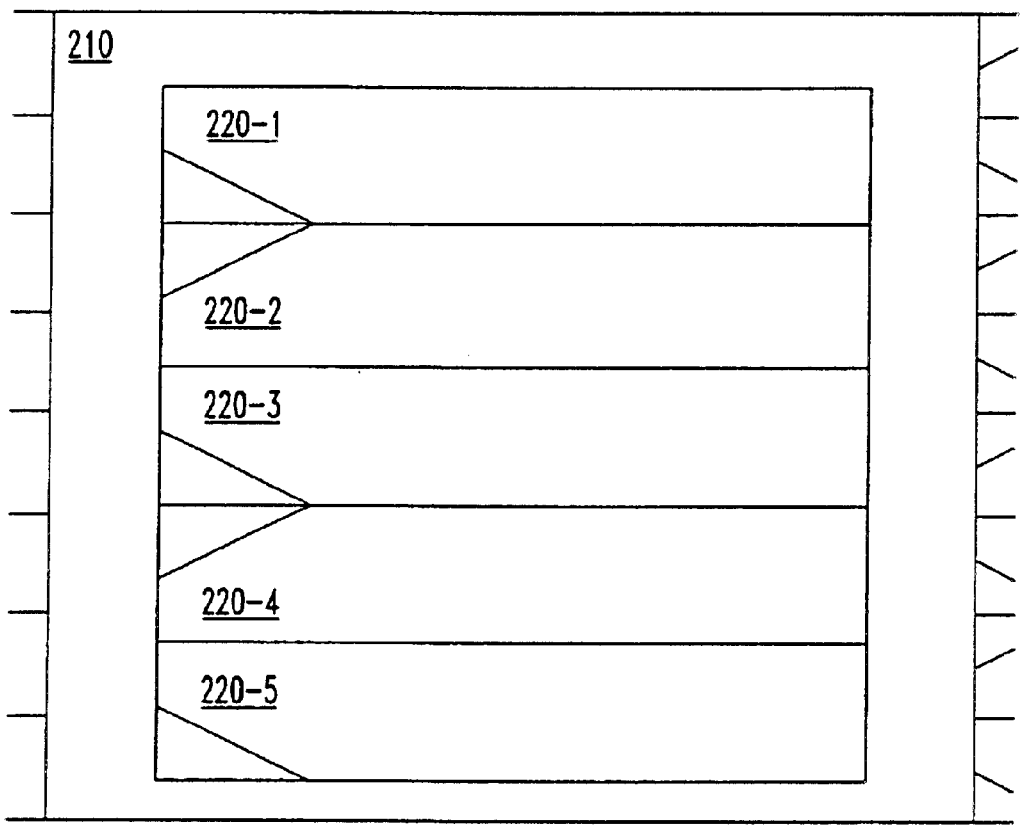
FIG. 6 shows a more detailed view of a particular one of the island areas of the FIG. 5 integrated circuit.

FIG. 6 shows a more detailed view of a particular one of the island areas 210 of the FIG. 5 integrated circuit. It can be seen that the island area 210 between rows 206A and 206B of the central circuitry portion 202 of integrated circuit 200□ includes five distinct rows of spare gates denoted 220-1, 220-2, 220-3, 220-4 and 220-5. Like the island areas, these rows of spare gates may be configured as part of a floorplan operation of the standard cell CAD tool.

Figure 7:
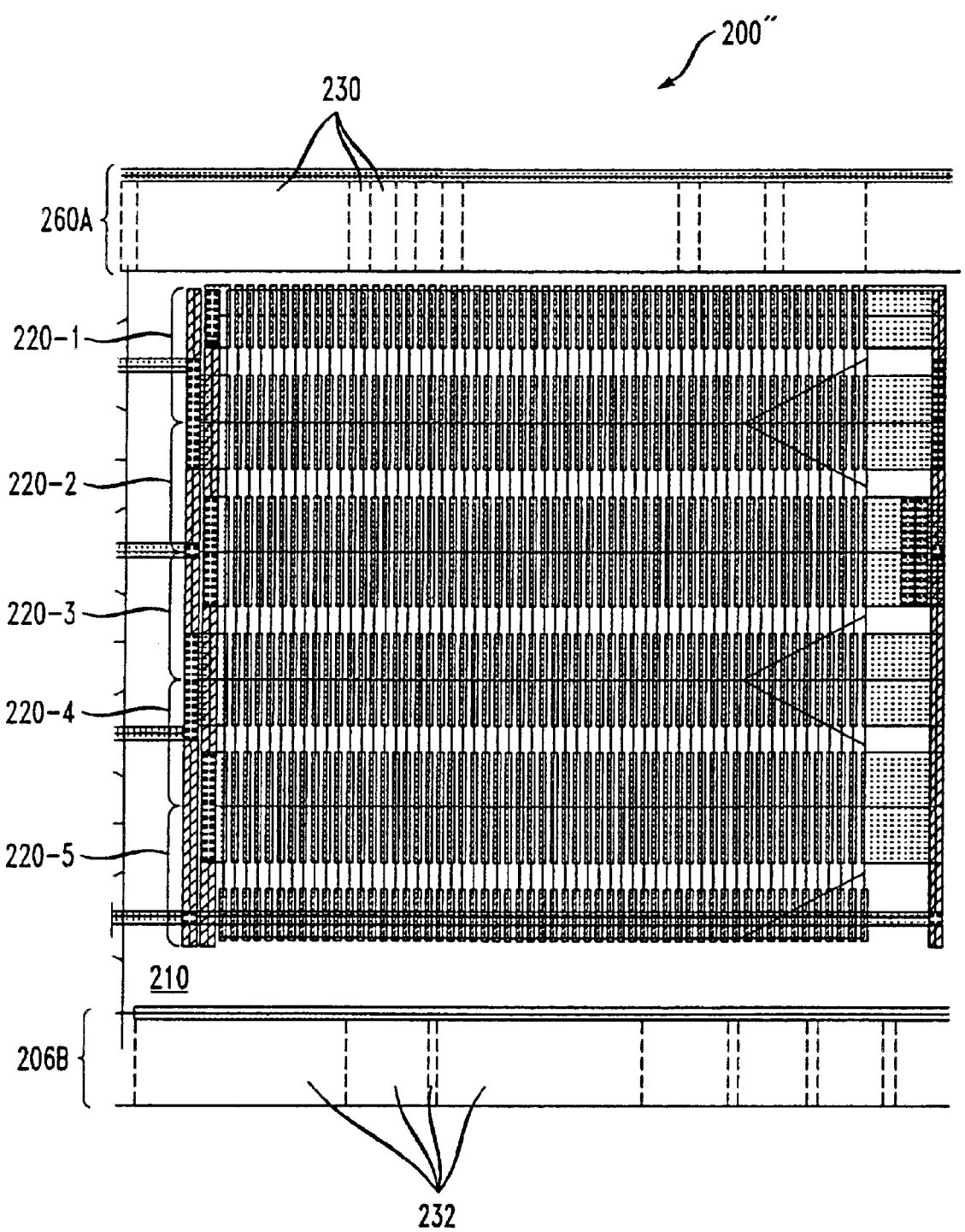
FIG. 7 illustrates the manner in which the spare gates of the FIG. 6 island area may be implemented by replication of the base transistor structure of FIG. 1.

FIG. 7 illustrates the manner in which the spare gates of the island area 210 of FIG. 6 may be implemented by replication of the base transistor structure of FIG. 1. In the portion of the circuit 200□ as shown in FIG. 7, the island area 210 can be seen to be arranged between standard cell row 206A comprising standard cell gates 230 and standard cell row 206B comprising standard cell gates 232. The boundaries of the individual standard cell gates 230 and 232 in their respective rows 206A and 206B are denoted by vertical dashed lines. Each of the rows of spare gates 220-1, 220-2, 220-3, 220-4 and 220-5 are implemented using multiple ones of the base transistor structure 100 of FIG. 1, arranged adjacent to one another as shown. In this embodiment, the spare gate rows 220 of spare gate area 210 can be readily configured to provide an array of spare gates in the form of multiple rows of base transistor structures. Examples of the manner in which multiple base transistor structures can be used to implement particular types of logic gates are described in the above-cited U.S. patent application Ser. No. 10/082,050. The base transistor structures are not interconnected to form specific types of gates in the FIG. 7 illustration, but a wide variety of such interconnections could be provided by one skilled in the art in a straightforward manner, as per the requirements of a particular application.

In the FIG. 7 example, each of the rows 220 in the spare gate island area 210 is completely filled with base transistor structures. If the same type of spare gate cell is replicated throughout the island area 210, with each cell using a particular number of base transistor structures, the corresponding arrangement may be viewed as an m×n array of spare gate cells, where both m and n are greater than one. However, the invention does not require that a given row be completely filled with base transistor structures or corresponding spare gate cells. For example, one or more of the rows 220 may be only partially filled with base transistor structures and corresponding spare gate cells, with additional structures and cells being added on an as-needed basis only. Although the island area 210 as shown in FIG. 7 includes multiple rows of spare gates, every spare gate island need not be configured in the same manner, and a given spare gate island may not include multiple rows of spare gates, i.e., may include only a single row of spare gates.

It should also be appreciated that the specific arrangements of spare gate islands shown in FIGS. 3 through 7 are by way of example only, and not intended to limit the scope of the invention in any way. In general, it is preferable to distribute the spare gate islands throughout the standard cell circuitry portion of the integrated circuit design in a manner, which facilitates the usage of the spare gates to accommodate design changes, which arise subsequent to placement and routing operations involving the standard cells. For example, the four spare gate island areas 210 in FIG. 3 are distributed in a substantially even manner throughout the central circuitry portion 202. This type of substantially even distribution of spare gates ensures that the conductor lengths required to connect a given one of the spare gates to one or more particular standard cell gates will not be excessive. Numerous other arrangement may be used. For example, a greater number or density of spare gate islands could be placed near circuitry, which is considered more likely to require future modification.

Figure 8:
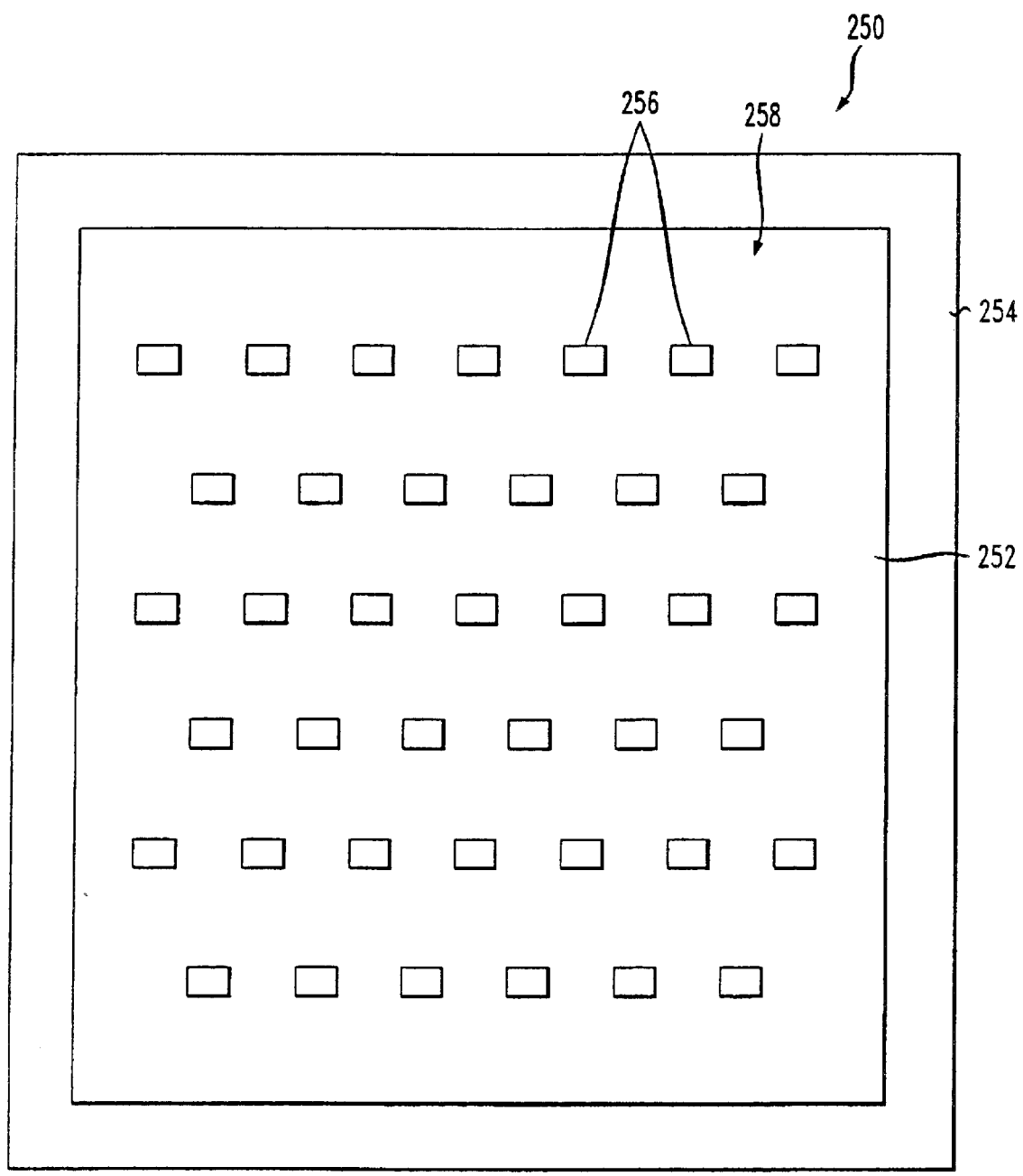
FIG. 8 shows another example arrangement of spare gate islands in an integrated circuit configured in accordance with the invention.

FIG. 8 shows another example arrangement of spare gate islands in an integrated circuit 250 configured in accordance with the invention. In this example, the spare gate islands are also distributed in a substantially even manner throughout the standard cell circuitry of the integrated circuit. More specifically, a "checkerboard" type of geometric pattern is used. The integrated circuit 250 includes a central circuitry portion 252 and an outer circuitry portion 254. The outer portion may include interface circuitry such as I/O buffer circuits and the like. The central circuitry portion includes a plurality of island areas 256 arranged in the above-noted checkerboard geometric pattern. The island areas 256 are placed within a standard cell region 258 of the central circuitry portion 252. Each of the island areas 256 may be configured to include an m×n array of spare gate cells, as previously described.

Placement of the spare gate islands in accordance with a predetermined geometric pattern as in FIG. 8 ensures that any repairs or other alterations of the corresponding integrated circuit design can be made in relatively close proximity to the need. Other types of substantially uniform distribution of spare gate islands throughout a standard cell portion of an integrated circuit may be used.

In general, the larger the number of spare gate islands used, the smaller the conductor routing distances that will be required when utilizing the spare gates, but the larger the number of standard cells that will be displaced. The particular configuration used will generally vary depending upon the specific needs of a given application.

Both standard cells and spare gate cells in accordance with the invention can be placed in accordance with a placement operation of an otherwise conventional automated place and route process. The use of spare gates formed from a base transistor structure compatible with the place and route process greatly facilitates routing between the spare gates and the standard cells in implementing integrated circuit design changes. Routing operations involving the standard cells and the spare gates can be implemented in a conventional manner, and are therefore not further described herein. The routing operations may make use of the antenna error correction techniques described in U.S. patent application Ser. No. 10/135,108, filed Apr. 30, 2002 and hereby incorporated by reference herein. More particularly, at least one of the spare gates may be implemented as a spare gate diode cell or other antenna error control circuitry, with the spare gate diode cell or other antenna error control circuitry being utilized to correct an antenna error associated with a particular signal line of the integrated circuit.

A significant advantage of the approach described above is that the unused spare gates do not require any netlist content. Only those spare gates that are actually converted to active gates of the circuit design become part of the netlist, which reduces the size of the netlist and simplifies netlist processing operations.

It should be appreciated that the integrated circuit drawings as shown in FIGS. 2 through 8 may be viewed as simplified drawings of at least a portion of an actual integrated circuit, or may be viewed as graphical representations of an integrated circuit design as generated on a monitor or other display associated with a computer or other standard cell CAD workstation.

As indicated previously, the present invention can be implemented in the form of an integrated circuit comprising a number of standard cells and one or more spare gate islands. A given integrated circuit constructed using the techniques of the invention can include spare gate cells constructed from the above-described base transistor structure or other suitable structures, in combination with other types of conventional standard cells. In these and other possible implementations of the invention, the base transistor structure cells may be used to supplement the use of standard cells, or to otherwise operate in conjunction with such standard cells, in order to produce advantages in the overall design and design process.

It should also be noted that the present invention can also be implemented at least in part in the form of software that is executed on a computer, workstation or other processing device having one or more processor elements and one or more memory elements. For example, a suitable representation of an integrated circuit design in accordance with the invention may be implemented in CAD tool software to be used on a computer or other workstation. The invention can thus be implemented on a computer or workstation in an otherwise conventional standard cell CAD environment.

The above-described embodiments of the invention are intended to be illustrative only. For example, although the invention has been illustrated in conjunction with a particular base transistor structure, alternative structures may be used to form spare gates in accordance with the invention. In addition, the particular number, type and arrangement of spare gate islands may be altered in accordance with the invention. Various combinations of particular modules, blocks, rows, aspect ratios, gate sizes and other parameters may be used in the arrangement of the spare gate islands. The number, type and arrangement of spare gates within a given spare gate island may also be varied. Furthermore, the particular manner in which the spare gate islands are interspersed with standard cells may be varied. These and other alternative embodiments within the scope of the appended claims will be readily apparent to those skilled in the art.

What is claimed is:

1. An integrated circuit comprising:
    a plurality of standard cells; and
    a plurality of spare gates interspersed with the standard cells;
    the plurality of spare gates being arranged in multiple groups of spare gates, at least a given one of the groups of spare gates being arranged between first and second rows of the standard cells.

2. The integrated circuit of claim 1 wherein at least the given one of the groups of spare gates comprises an m×n array of spare gate cells arranged between the first and second rows of the standard cells, where both m and n are greater than one, each of at least a subset of the spare gates in the given group comprising a plurality of base transistor structures.

3. The integrated circuit of claim 1 wherein the multiple groups of spare gates are configured as a plurality of spare gate islands distributed throughout a standard cell portion of the integrated circuit, with one or more of the spare gate islands comprising an array of spare gate cells arranged between rows of the standard cells.

4. The integrated circuit of claim 1 wherein a total number of the spare gate groups is greater than or equal to four.

5. The integrated circuit of claim 1 wherein at least one of the spare gates comprises a spare gate diode cell.

6. An integrated circuit comprising:
    a plurality of standard cells; and
    a plurality of spare gates interspersed with the standard cells in a substantially uniform manner.

7. The integrated circuit of claim 6, wherein the spare gates are interspersed with the standard cells in accordance with a predetermined geometric pattern.

8. The integrated circuit of claim 6 wherein at least one of the spare gates is convertible to an active logic gate using connections formed in one or more metallization layers of the integrated circuit.

9. The integrated circuit of claim 6 wherein the spare gates of the integrated circuit are each formed using one or more base transistor structures and the standard cells are not formed using the base transistor structures.

10. The integrated circuit of claim 6 wherein each of at least a subset of the spare gates comprises a spare gate cell implemented using one or more base transistor structures.

11. The integrated circuit of claim 10 wherein the base transistor structure comprises:
    a plurality of source regions;
    a plurality of drain regions, each adjacent to a corresponding one of the source regions; and
    at least first and second elongated gates, the first and second gates each overlying a corresponding subset of the source and drain regions, the first and second gates each extending longitudinally along a first axis from a first end adjacent one of the source and drain regions to a second end extending past another of the source and drain regions, the first and second gates being separated from one another at the second ends thereof;
    the base transistor structure being substantially symmetric about the first axis.

12. The integrated circuit of claim 6, wherein the plurality of spare gates are configured as spare gate islands distributed among a standard cell portion of the integrated circuit.

13. A method of designing an integrated circuit, comprising:

provide a plurality of standard cells;

providing a plurality of spare gates; and interspersing the plurality of spare gates with the standard cells in a substantially uniform manner.

14. The method of claim 13, wherein interspersing the plurality of spare gates with the standard cells comprises arranging the plurality of spare gates in multiple groups, at least a given one of the groups of spare gates being arranged between first and second rows of the standard cells.

15. The method of claim 13, wherein the spare gates are interspersed with the standard cells in accordance with a predetermined geometric pattern.

16. The integrated circuit of claim 13, wherein at least a portion of the standard cells and spare gates are interspersed in accordance with a placement operation of an automated place and route process of a standard cell design tool.

17. The integrated circuit of claim 13 including defining an area within the integrated circuit for the spare gates using a floorplan operation of a standard cell design tool.

18. An article of manufacture on which is stored a computer program for use in designing an integrated circuit, wherein the program when executed implements the following method:

providing a plurality of standard cells;

providing a plurality of spare gates; and interspersing the plurality of spare gates with the standard cells in a substantially uniform manner.

19. The article of manufacture of claim 18, wherein interspersing the plurality of spare gates with the standard cells comprises arranging the plurality of spare gates in multiple groups, at least a given one of the groups of spare gates being arranged between first and second rows of the standard cells.

20. The article of manufacture of claim 18, wherein the spare gates are interspersed with the standard cells in accordance with a predetermined geometric pattern.

* * * * *